US005480822A

United States Patent [19]
Hsue et al.

[11] Patent Number: 5,480,822
[45] Date of Patent: Jan. 2, 1996

[54] METHOD OF MANUFACTURE OF SEMICONDUCTOR MEMORY DEVICE WITH MULTIPLE, ORTHOGONALLY DISPOSED CONDUCTORS

[75] Inventors: Chen-Chiu Hsue; Ming-Tzong Yang, both of Hsin Chu, Taiwan

[73] Assignee: United Microelectronics Corporation, Hsinchu, Taiwan

[21] Appl. No.: 345,127

[22] Filed: Nov. 28, 1994

[51] Int. Cl.$^6$ .................................. H01L 21/265
[52] U.S. Cl. .................................. 437/48; 437/45
[58] Field of Search .................. 437/43, 47, 52, 437/915, 919, 48, 45

[56] References Cited

U.S. PATENT DOCUMENTS

| | | | |
|---|---|---|---|
| 5,204,542 | 4/1993 | Namaki et al. | 257/315 |
| 5,270,240 | 12/1993 | Lee | 437/52 |
| 5,306,657 | 4/1994 | Yang | 437/52 |
| 5,306,935 | 4/1994 | Esquivel et al. | 257/315 |

Primary Examiner—Mary Wilczewski
Assistant Examiner—H. Jey Tsai
Attorney, Agent, or Firm—George O. Saile; Jerry Jones

[57] ABSTRACT

In accordance with this invention, a method of manufacture of a semiconductor memory device comprises the following steps: forming field oxide structures on a semiconductor substrate, forming a gate oxide layer on exposed surfaces of the substrate, forming a first word line layer on the device, patterning the first word line layer by forming a first patterned mask mask with a first set of openings therein and etching the first word line layer through the openings in the first mask to form conductor lines, forming a first dielectric layer on the surface of the first word line layer on the device, forming a second word line layer on the first dielectric layer, patterning the second word line layer by forming a second patterning mask with a second set of openings therein and etching portions of the second word line layer therethrough, h)forming a second dielectric layer on the surface of the second word line layer on the device, and implanting ions of dopant into predetermined locations into the semiconductor substrate of the device, the dopant being of sufficient concentration to form a doped region therein.

17 Claims, 13 Drawing Sheets

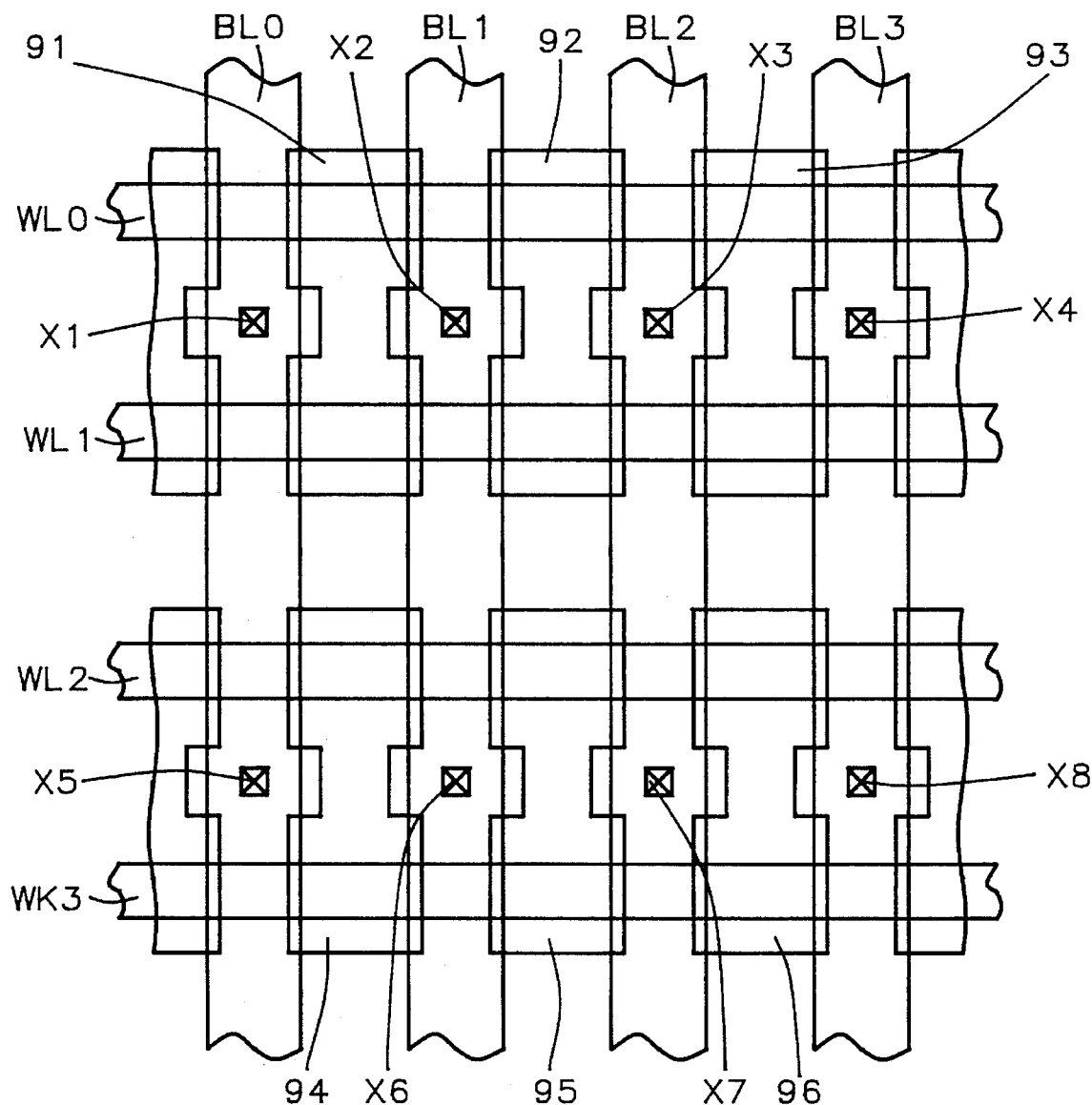
*FIG. 17 - Prior Art*

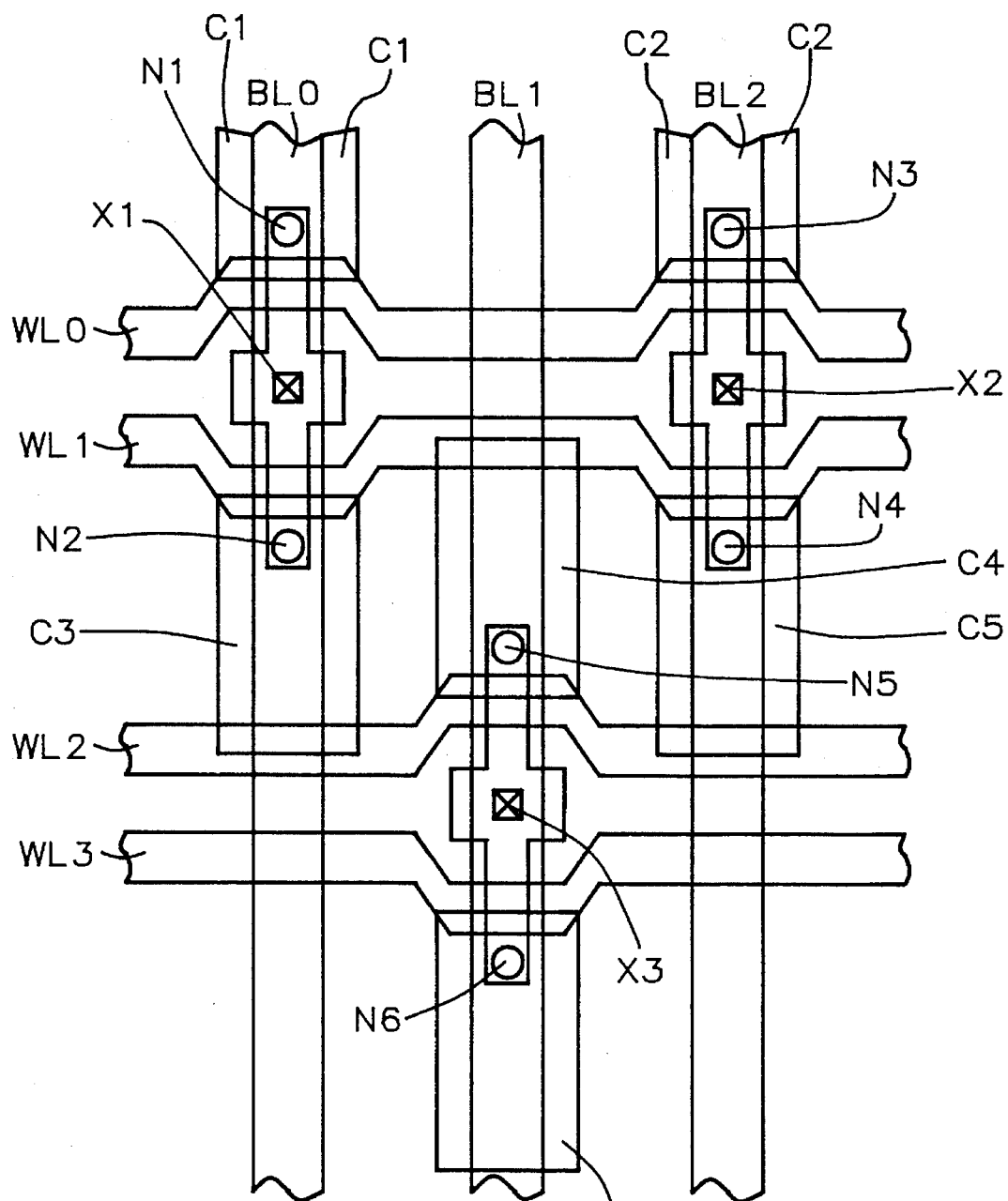
FIG. 18 – Prior Art

METHOD OF MANUFACTURE OF SEMICONDUCTOR MEMORY DEVICE WITH MULTIPLE, ORTHOGONALLY DISPOSED CONDUCTORS

BACKGROUND OF THE INVENTION

1. Field of the Invention

This invention relates to semiconductor devices and more particularly to memory devices and the methods of manufacture thereof.

2. Description of Related Art

U.S. Pat. No. 5,204,542 of Namaki et al "Nonvolatile Semiconductor Memory Device of Shared Contact Scheme Not Having Inclined Wiring" uses diffused layers in silicon and polysilicon for shared contacts.

Sharing of the same contacts by two cells is not sufficient because the contact and relative design rule will limit the cell size.

FIG. 17 shows a prior art plan view of a ROM, EPROM or Flash memory device. The prior art device of FIG. 17 includes horizontally disposed word lines WL0, WL1, WL2, and WL3 and bit lines BL0, BL1, BL2, and BL3; bit line common contacts X1, X2, X3, X4, X5, X6, X7 and X8; and field oxide elements 91, 92, 93 94, 95 and 96.

FIG. 18 shows a prior art plan view of a DRAM. The horizontally disposed word lines WL0, WL1, WL2, and WL3 and vertical disposed bit line drain contacts BL0, BL1, and BL2. There are contact regions X1, X2, and X3 which connect to bit lines BL0, BL1, and BL2.

The DRAM memory nodes N1, N2, N3 N4, N5 and N6 connect to the capacitors C1, C2, C3, C4, C5 and C6.

SUMMARY OF THE INVENTION

An advantage of this invention is that a four direction cell is provided with a common bit line contact. Thus, the density is high. This structure is adapted to use with any single bit line memory cell such as a ROM, EPROM, Flash memory, DRAM, etc.

Another advantage of this invention is that it uses two layers of polysilicon for shared contacts instead of diffused layers in silicon and polysilicon for shared contacts. If we share the diffused layers for a lot of the cell, the sheet resistance of the bit lines is high. In that case, manufacture of a high speed memory is very difficult. For example, in a buried N+ (BN+) flat cell ROM, a prior art memory cell is small, but the speed is slow, but for a device in accordance with this invention, the multiple cell memory has the advantage of both small cell size and high speed.

In accordance with this invention, a method of manufacture of a semiconductor memory device comprises the following steps: a) forming field oxide structures on a semiconductor substrate, b) forming a gate oxide layer on exposed surfaces of the substrate, c) forming a first word line layer on the device, d) patterning the first word line layer by forming a first patterned mask mask with a first set of openings therein and etching the first word line layer through the openings in the first mask to form conductor lines, e) forming a first dielectric layer on the surface of the first word line layer on the device, f) forming a second word line layer on the first dielectric layer, g) patterning the second word line layer by forming a second patterned mask with a second set of openings therein and etching portions of the second word line layer therethrough, h)forming a second dielectric layer on the surface of the second word line layer on the device, and i)implanting ions of dopant into predetermined locations into the semiconductor substrate of the device, the dopant being of sufficient concentration to form a doped region therein. Preferably, the first dielectric layer comprises ONO; following implanting of ions, a dielectric layer is deposited; following the BPSG deposition, a contact mask is formed over the BPSG layer followed by etching of the dielectric layer to form a contact opening; following the contact mask formation a metal sputtering step is performed, and the first and second word lines comprise polysilicon.

In accordance with another aspect of this invention, a method of manufacture of a semiconductor memory the device comprises: forming field oxide structures on a semiconductor substrate, forming a gate oxide layer on exposed surfaces of the substrate, forming a first polysilicon layer on the device, patterning the first polysilicon layer by forming a mask with openings and etching first polysilicon layer through the openings in the mask to form the conductor lines, forming a first dielectric layer on the surface of the first polysilicon layer on the device, forming a second polysilicon layer on the first dielectric layer, forming a photolithographic mask and etching portions of the second polysilicon layer, forming a second dielectric layer on the surface of the second polysilicon layer on the device, forming a third polysilicon layer on the second dielectric layer, patterning the third polysilicon layer by forming a mask and etching the polysilicon through the mask, forming a third dielectric layer on the surface of second polysilicon layer on the device, forming a fourth polysilicon layer on the second dielectric layer, patterning the fourth polysilicon layer by forming a mask and etching the polysilicon through the mask, and implanting ions of dopant into predetermined locations into the semiconductor substrate of the device, the dopant being of sufficient concentration to form a doped region therein. Preferably. following the BPSG deposition, a contact mask is formed followed by etching the BPSG layer with an RIE etcher to form a contact opening therein; following the contact mask formation a metal sputtering step is performed.

In accordance with another aspect of this invention, a method of manufacture of a DRAM semiconductor memory device comprising the following steps: a) forming field oxide structures on a semiconductor substrate, b) forming a gate oxide layer on exposed surfaces of the substrate, c) forming a first polysilicon layer on the device, d) patterning the first polysilicon layer by forming a mask with openings and etching the first polysilicon layer through the openings in the mask to form conductor lines, e) forming a first dielectric layer on the surface of the first polysilicon layer on the device, f) forming a second polysilicon layer on the first dielectric layer, g) forming a patterned photolithographic mask and etching portions of the second polysilicon layer, h) forming a second dielectric layer on the surface of the second polysilicon layer on the device, and i) implanting ions of dopant into predetermined locations into the semiconductor substrate of the device, the dopant being of sufficient the concentration to form a doped region therein, j) depositing a silicon dioxide layer over the device, k) forming via openings in the silicon dioxide layer, l) forming and patterning a capacitor plate layer on the device, m)forming an interconductor dielectric layer over the the capacitor plate layer, and n) forming and patterning an upper conductor layer over the interconductor dielectric layer. Preferably, the first dielectric layer comprises ONO; following the implanting of ions, a dielectric layer is deposited; following the BPSG deposition, a contact mask is formed over the BPSG layer followed by etching of the dielectric layer to form a contact opening; following the contact mask formation a metal sputtering step is performed.

In accordance with still another aspect of this invention, a method of manufacture of a semiconductor memory the device comprises: forming field oxide structures on a semiconductor substrate, forming a gate oxide layer on exposed surfaces of the substrate, forming a first polysilicon layer on the device, patterning the first polysilicon layer by forming a mask with openings and etching the first polysilicon layer through the openings in the mask to form the conductor lines, forming a first dielectric layer on the surface of the first polysilicon layer on the device, forming a second polysilicon layer on the first dielectric layer, forming a photolithographic mask and etching the portions of the second polysilicon layer, forming a second dielectric layer on the surface of the second polysilicon layer on the device, forming a third polysilicon layer on the second dielectric layer, patterning the third polysilicon layer by forming a mask and etching the polysilicon through the mask, forming a third dielectric layer on the surface of second polysilicon layer on the device, forming a fourth polysilicon layer on the second dielectric layer, patterning the fourth polysilicon layer by forming a mask and etching the polysilicon through mask, and implanting ions of dopant into predetermined locations into the semiconductor substrate of the device, the dopant being of sufficient concentration to form a coded region therein. Preferably the first dielectric layer comprises ONO; the first dielectric layer comprises an oxide; following the implanting of ions, a blanket BPSG dielectric layer is deposited; following the BPSG deposition, a contact mask is formed followed by etching the BPSG layer with an RIE etcher to form a contact opening therein; following the contact mask formation a metal sputtering step is performed;

In accordance with another aspect of a semiconductor memory device, the device comprises: a semiconductor substrate, a plurality of memory elements arranged in sets of four memory cells on the surface of the substrate formed in a matrix, two arrays of parallel word lines and an array of parallel bit lines, each of the arrays being located in a separate one of three parallel planes extending across the substrate, each array of word lines and the array of bit lines extending in the three planes in a different direction across the substrate, and sets of word lines being connected respectively in different combinations to the sets of four memory cells with each set of four memory cells having a common bit line contact. Preferably, the word lines are composed of polysilicon.

A semiconductor memory device in accordance with this invention formed on a semiconductor substrate comprises: field oxide structures and a gate oxide layer formed upon the surface of the substrate, a first set of parallel conductor lines formed from a first polysilicon layer on the device, a first dielectric layer formed on the surface of the parallel conductor lines, a second polysilicon layer on the first dielectric layer, a second dielectric layer on the surface of the second polysilicon layer on the device, and implanted ions of dopant in predetermined locations into the semiconductor substrate of the device, the dopant providing a coded region therein. Preferably, the first dielectric layer comprises ONO.

In accordance with another aspect of this invention, a semiconductor memory device comprising: field oxide structures on a semiconductor substrate, a gate oxide layer on exposed surfaces of the substrate, a first polysilicon layer on the device, first polysilicon layer patterned with into the form of conductor lines, a first dielectric layer on the surface of the first polysilicon layer on the device, a second polysilicon layer on the first dielectric layer, a second dielectric layer on the surface of the second polysilicon layer on the device, a third polysilicon layer on the second dielectric layer, a third dielectric layer on the surface of the second polysilicon layer on the device, a fourth polysilicon layer on the second dielectric layer, and ions of dopant implanted into predetermined locations into the semiconductor substrate of the device, the dopant being of sufficient concentration to form a coded region therein.

BRIEF DESCRIPTION OF THE DRAWINGS

The foregoing and other aspects and advantages of this invention are explained and described below with reference to the accompanying drawings, in which:

FIG. 17 shows a prior art plan view of a ROM, EPROM or Flash memory device including horizontally disposed word lines and bit lines; contact regions and field oxide elements.

FIG. 18 shows a prior art plan view of a DRAM. The horizontally disposed word lines and vertical disposed bit lines. There are contact regions which connect to bit lines.

DESCRIPTION OF THE PREFERRED EMBODIMENT

Process for Formation of LOCOS Field Oxide and Polysilicon 1

FIGS. 1–3 and 5–13 show the process flow of the manufacture of a device in accordance with the process of this invention. FIGS. 1–3 and 5–13 show a cross section of various stages of manufacture of a device 10 in accordance with the process of this invention. Device 10 includes a silicon semiconductor P-substrate 11.

Figure 1:
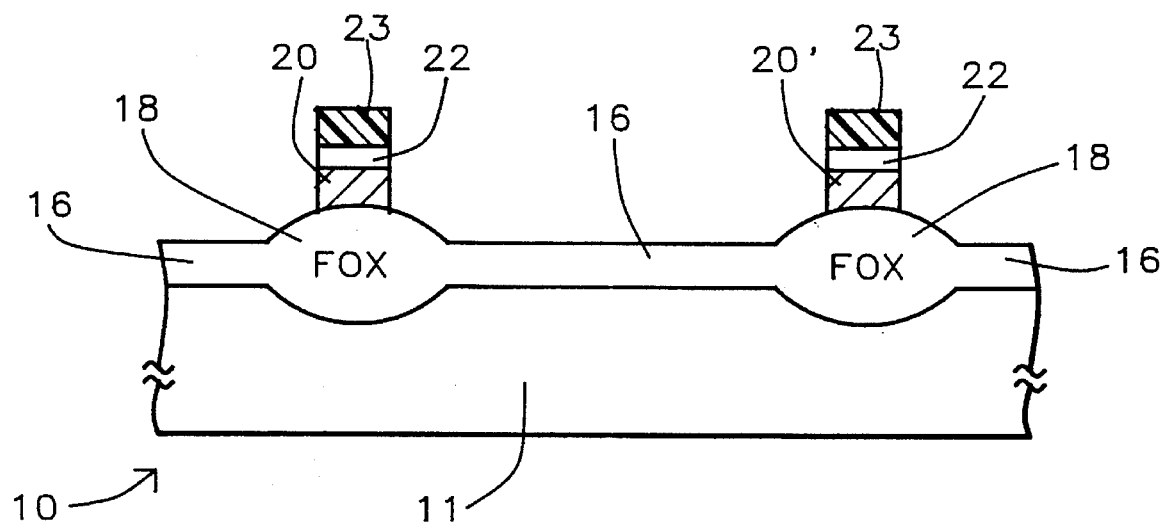
FIGS. 1–3, 5–7, 8A, 8B and 9–13, show a cross sectional view of various stages of the process flow for the manufacture of a device in accordance with the process of this invention.
Figure 4:
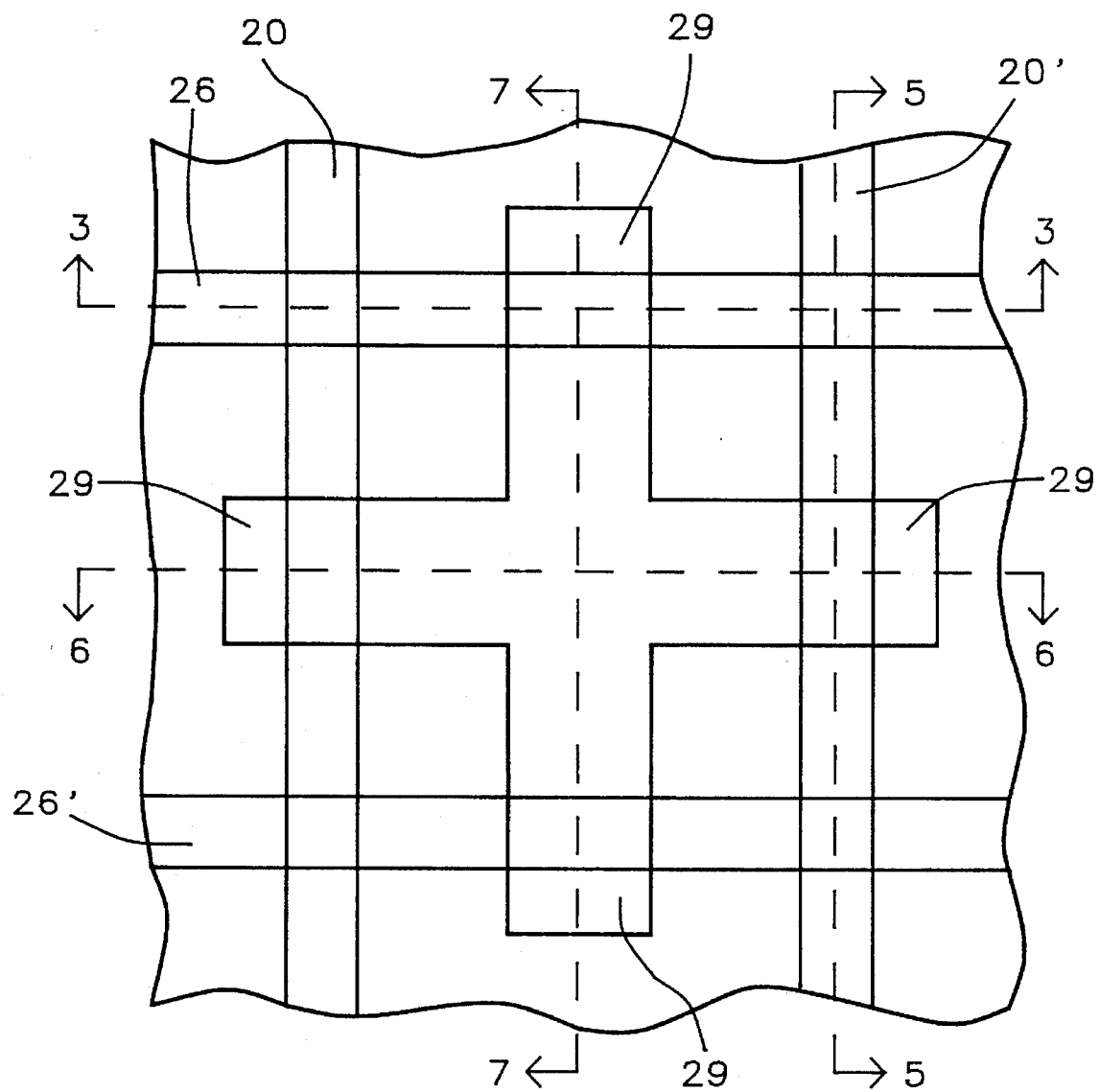
FIG. 4 is a plan view of a memory device in accordance with this invention.

FIG. 1 shows the device 10 which preferably has been processed in accordance with the well known preliminary steps as follows:

A thermal oxide (not shown) with a thickness range between about 50 Å and 500 Å was formed to provide a pad silicon dioxide layer on a silicon semiconductor P-substrate 11 of device 10. A layer of of silicon nitride ($Si_3N_4$) (not shown) is deposited by LPCVD having a thickness of within the range between about 500 Å and about 5,000 Å; a conventional form of photoresist mask (not shown) for the active area 29 (to be patterned as shown in FIG. 4) is applied to the device 10, and the silicon nitride ($Si_3N_4$) layer is then etched through the active mask into the pattern of region 29 in FIG. 4. The etching of the silicon nitride (SiN$_4$) layer is then performed using plasma etching in a plasma chamber within the RF power range between about 50 watts and about 1,500 watts and within a pressure range between about 1 mTorr and about 100 Torr.

Field Oxide

FIG. 1 shows conventional field oxide (FOX) regions 18 process formed by the conventional process. Then the silicon nitride layer (described above) deposited previously (not shown) is stripped from the device with phosphoric acid H$_3$PO$_4$ solution.

Gate Oxide Layer

FIG. 1 shows a gate oxide layer 16 which was is formed on semiconductor P-substrate (P-sub) 11 by the process of thermal growth in a furnace chamber within the temperature range between about 700° C. and about 1,000° C. and within a pressure range between about 1 mTorr and about 1,000 Torr.

First Polysilicon Layer and Doping Thereof

Referring again to FIG. 1, a polysilicon 1 layer 20 was next deposited upon gate oxide layer 16 and the FOX regions 18, followed by conventional doping.

The polysilicon 1 layer 20 is deposited by the process of LPCVD (Low Pressure Chemical Vapor Deposition) within a pressure range between about 0.1 mTorr and about 100 Torr at a temperature within the range between about 500° C. and about 750° C.

Doping is performed by diffusion of POCl$_3$ into layer 20 or implantation at a doping level within the range between about 1 E 17 cm$^{-3}$ and about 1 E 22 cm$^{-3}$.

CVD Silicon Dioxide or Thermal Silicon Dioxide

CVD silicon dioxide deposition formation of silicon dioxide layer 22 by deposition or thermal oxidation upon polysilicon 1 layer 20.

Mask for First Polysilicon Layer

A polysilicon 1 photoresist mask 23 is formed (by depositing photoresist which is then exposed to a pattern and developed) upon the silicon dioxide layer 22 for etching of silicon dioxide layer 22 and the polysilicon 1 layer 20 layer, in order to pattern layer 20 into parallel conductor lines 20 and 20' as seen in FIG. 4. Conductor lines 20 and 20' extend into the page as seen in cross section in FIGS. 1, 2, 3A and 3B.

Silicon Dioxide Etch

Mask 23 is then used for etching of silicon dioxide layer 22 in order to pattern silicon dioxide layer 22 as shown in FIG. 1.

Etching of First Polysilicon Layer

The polysilicon 1 layer 20 is then etched through the mask 23 using plasma etching in a plasma chamber within the RF power range between about 50 watts and about 5,000 watts and within a pressure range between about 1 mTorr and about 100 Torr, forming lines 20 and 20' as seen in FIG. 4.

Next, the photoresist mask 23 is stripped leaving the remaining stacks polysilicon 1 lines 20, 20' and silicon dioxide layer 22 on top of FOX structures 18.

Figure 2:
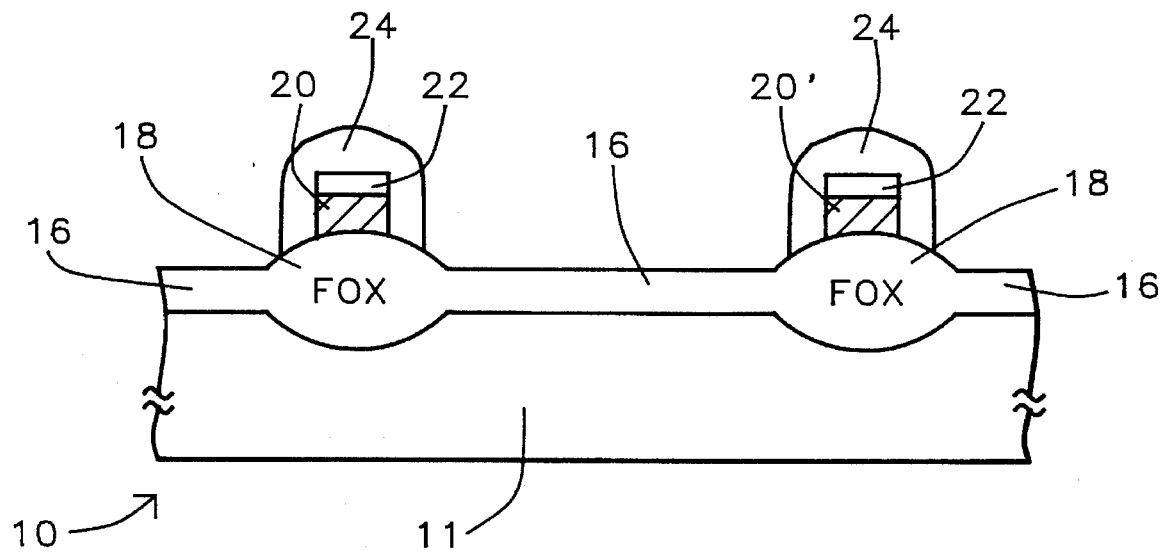

Referring to FIG. 2, additional steps of a process in accordance with this invention are as follows:

Deposition of CVD Silicon Dioxide Spacer Layer

A blanket silicon dioxide layer 24 was formed by deposition or thermal oxidation upon the device of FIG. 1, after the mask 23 has been removed.

Spacer Etch

As seen in FIG. 2, the silicon dioxide spacer layer 24 has been etched Just long enough to leave spacer structures 24 over the FOX regions 18 and the stacks of polysilicon 1 lines 20, 20' and silicon dioxide layer 22. The etching process used is conventional and is timed to leave the spacer protection required, and as shown in FIG. 2.

Figure 3:
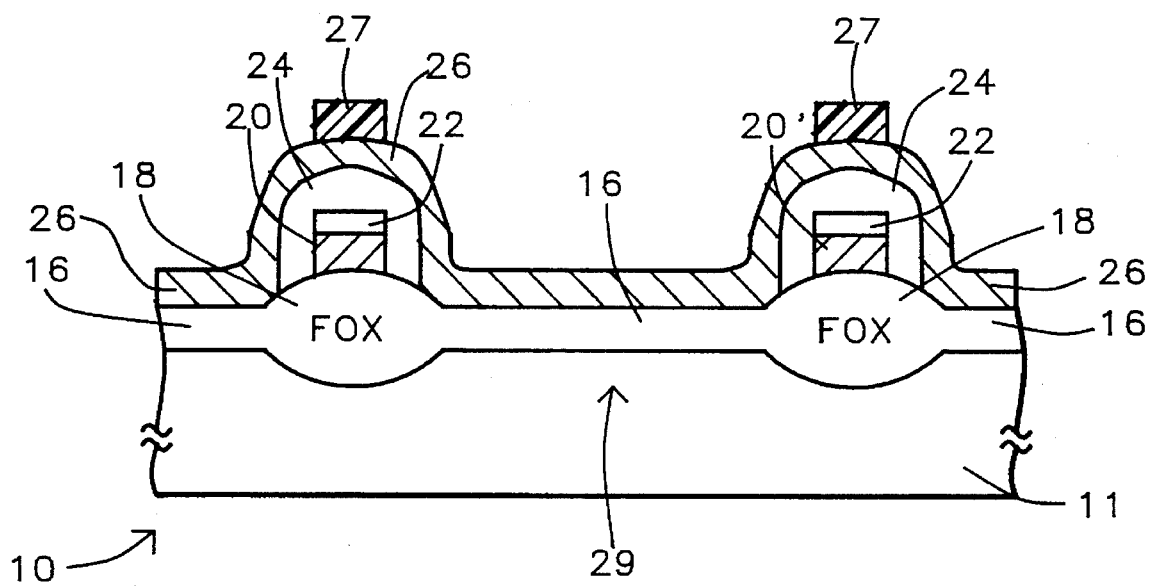
Figure 5:
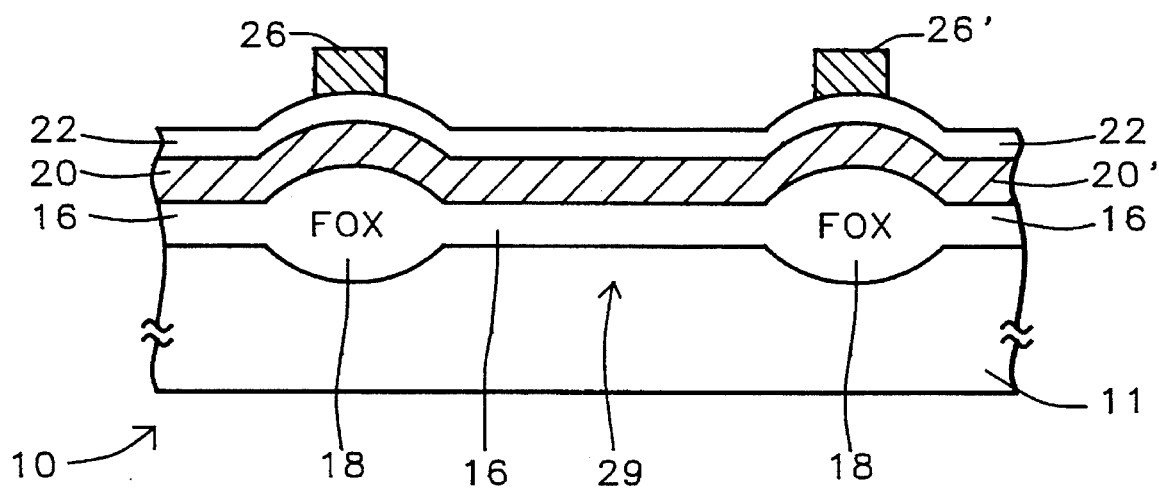

Referring to FIG. 3 and 5, which are sectional views taken along line 3—3 and 5—5 in FIG. 4, an additional set of steps of a process for manufacture of a semiconductor memory in accordance with this invention are as follows:

Gate silicon dioxide 2

Gate oxide 2 layer 16 is formed on semiconductor P-substrate 11 by the process of thermal growth in a furnace chamber within the temperature range between about 700° C. and about 1,000° C. and within a pressure range between about 1 mTorr and about 1,000 Torr.

Polysilicon 2 Deposition and Doping

Referring to FIG. 3, a blanket deposit of polysilicon 2 layer 26 is formed upon gate oxide layer 16 and spacer structures 24 and the exposed portions of FOX regions 18, followed by conventional doping. Preferably, the polysilicon 2 blanket layer 26 is deposited by the process of LPCVD (Low Pressure Chemical Vapor Deposition) within a pressure range between about 0.1 m Torr and about 100 Torr at a temperature within the range between about 500° C. and about 750° C.

Doping is performed by diffusion of POCl$_3$ or ion implantation at a doping level within the range between about 1 E 17 cm$^{-3}$ and about 1 E 22 cm$^{-3}$.

Formation of Polysilicon 2 Mask

A polysilicon 2 photoresist mask 27 is formed (by depositing photoresist which is then exposed to a pattern and developed) upon the polysilicon 2 layer 26 layer in order to pattern layer 26 forming X word conductor lines 26, 26' as shown in FIG. 4 and FIG. 5, at right angles to Y word conductor lines 20, 20' as shown in FIG. 4.

polysilicon 2 etch

FIG. 5 taken along line 5—5 in FIG. 4 shows the device of FIG. 3 after the polysilicon 2 layer 26 has been etched through the mask 27 using plasma etching in a plasma chamber within the RF power range between about 50 watts and about 1,500 watts and within a pressure range between about 1 mTorr and about 100 Torr.

FIG. 4 is a plan view of a memory device in accordance with this invention showing a plan view after formation of the X word lines 26, 26' and the Y word lines 20, 20'.

FIG. 5 shows a section taken along line 5—5 in FIG. 4, which is at right angles to the section shown in FIG. 3, along the length of line 20'.

N+ S/D Mask and Ion Implant

Figure 6:
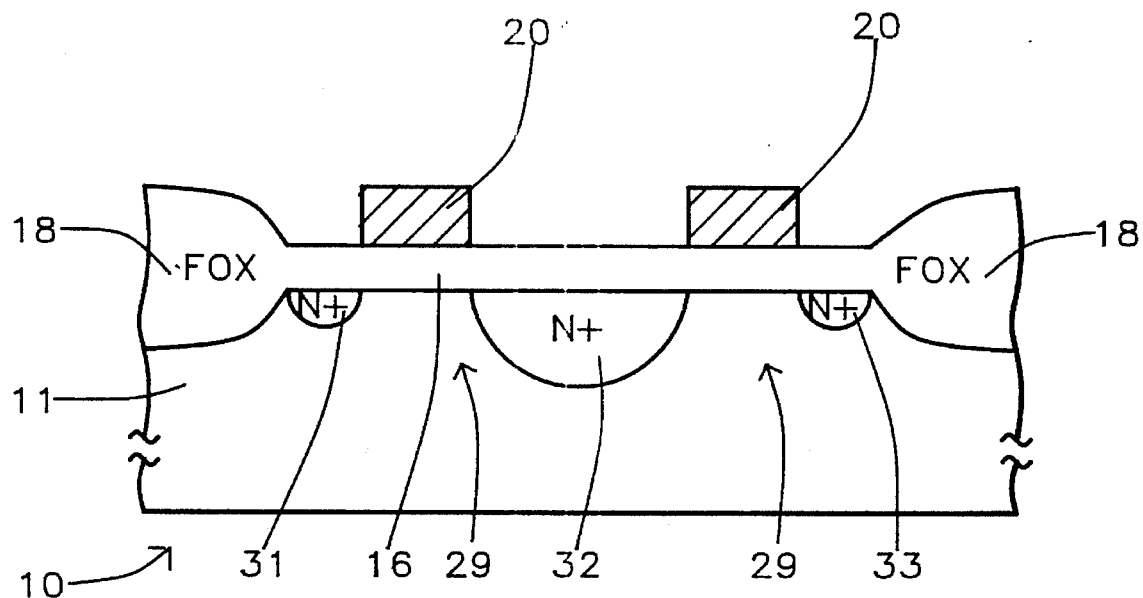
Figure 7:
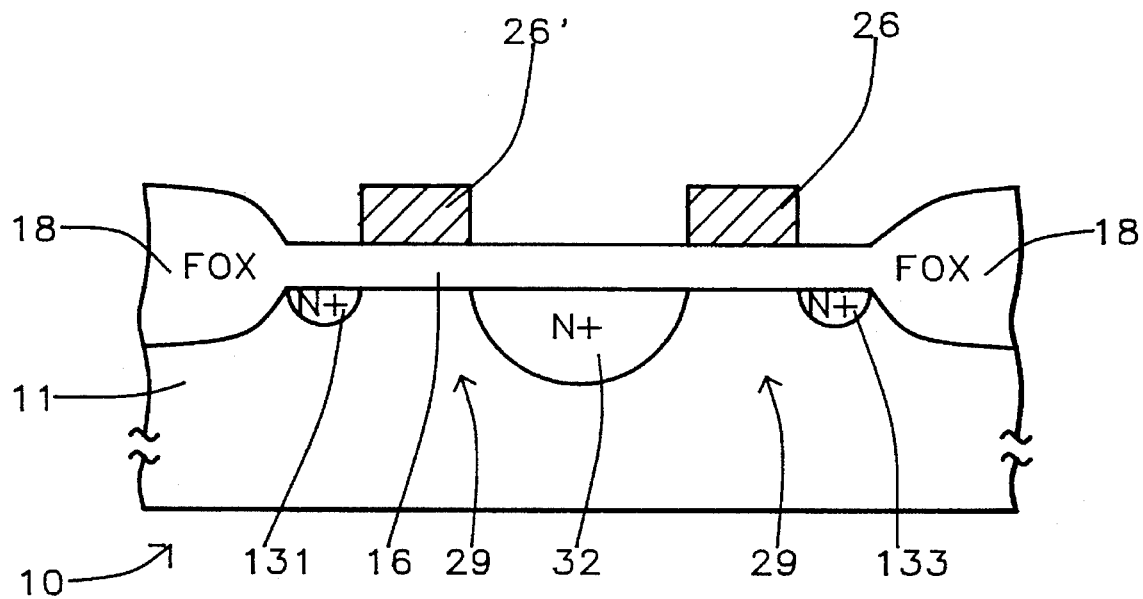

A conventional N+ S/D implant process follows employing conventional ion implantation, the results of which are illustrated by FIGS. 6 and 7.

FIG. 6 shows a section taken along line 6—6 in FIG. 4 looking in the opposite direction from FIG. 3, with the N+ S/D regions 31, 32, and 33 in the substrate 11, between the conductors 20, 20' and FOX regions 18.

FIG. 7 shows a section taken along line 7—7 in FIG. 4 with the N+ S/D regions 131, 32, and 133 in the substrate 11, between the conductors 26, 26' and other FOX regions 18.

Contact and Metal Process

Figure 8A:
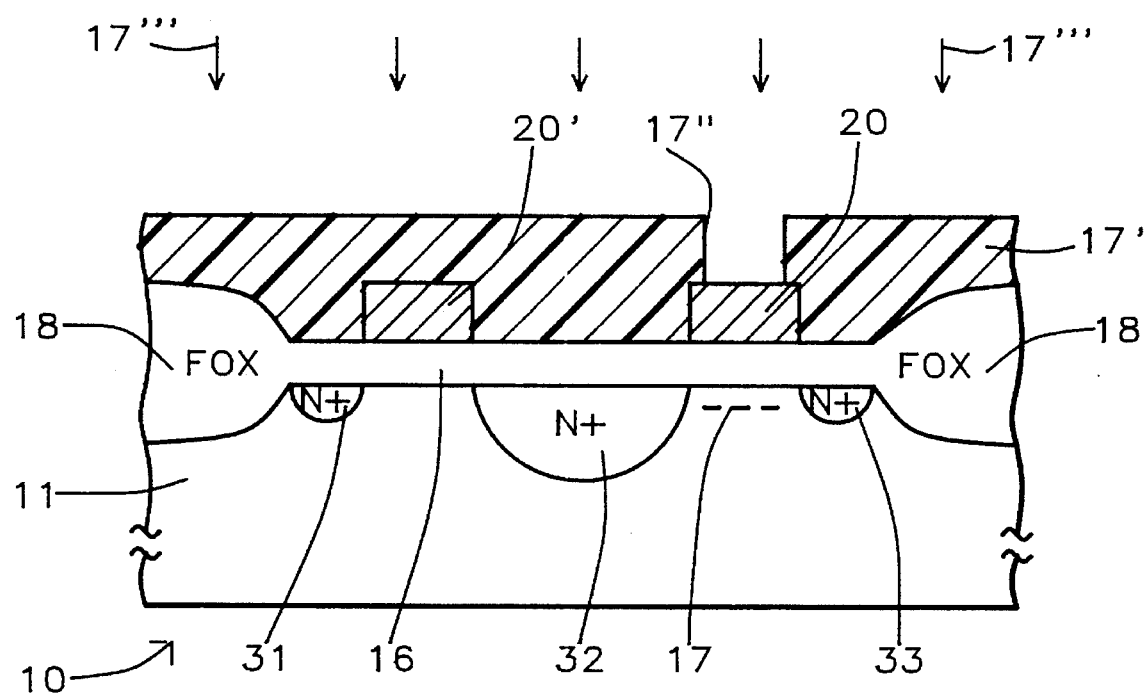
Figure 8B:
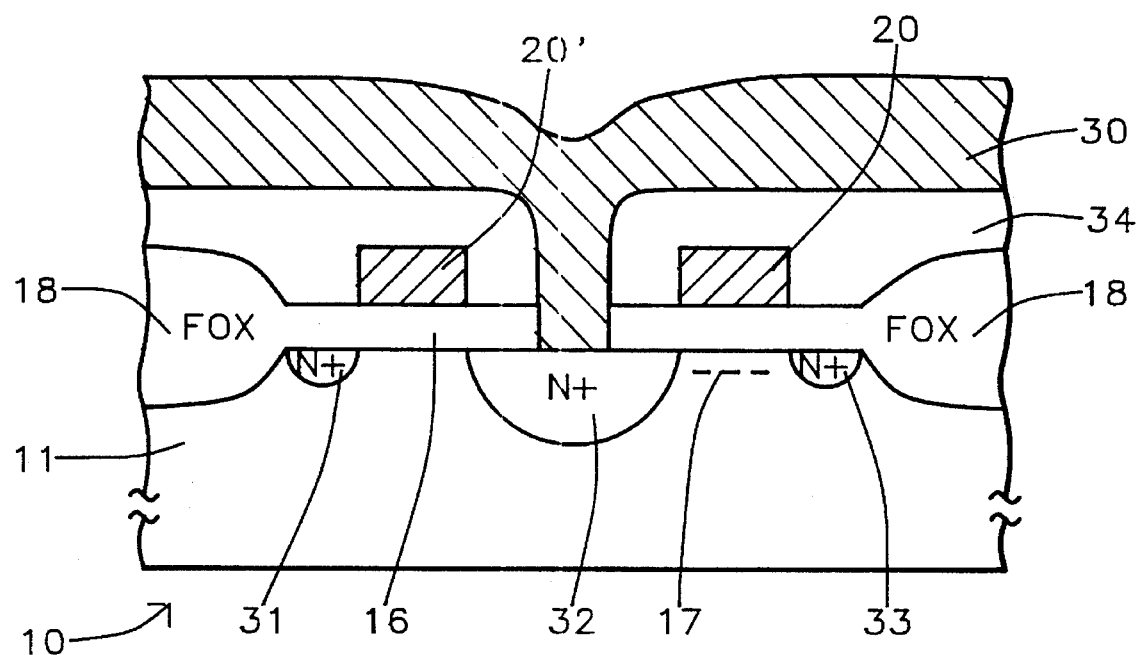

Referring to FIGS. 8A and 8B, the steps of a process in accordance with this invention are as follows:

Process of Formation of ROM

ROM mask and Ion Implantation

A lithography masking step is performed by means of conventional lithography with a ROM code mask 17' with an opening 17" for ion implantation of ions 17''' is performed in selected regions exposed through openings in the mask 17'. The ROM code implant is provided using ions 17''' of boron with a dose of between about 1 E 12 $cm^{-2}$ and about 1 E 15 $cm^{-2}$ with an energy of between about 30 keV and about 500 keV, with the implanted dopant 17 reaching a depth of between about 0.1 µm and about 2 µm.

BPSG Deposition

After the mask 17' has been removed from the device of FIG. 8A, a glass layer 34, preferably composed of BPSG has been formed with a thickness of between about 2,000 Å and about 10,000 Å with boron (B) about 2%–8% and phosphorous (P) about 2%–8%.

The device is next heated to reflow the BPSG layer 34 at a temperature of between about 700° C. and about 1,000° C.

BPSG layer 34 is deposited to a thickness of about 7,200 Å with boron (B) about 3.0% and phosphorous (P) about 4.6%. The process used in the prior art to deposit the BPSG layer 26 also comprises APCVD.

The process used to deposit the BPSG layer 34 is selected from APCVD, PECVD, LPCVD (Low Pressure C.V.D.) to deposit BPSG, BPTEOS, TEOS, etc. Formation of Contacts and Metal Process for ROM, EPROM

Contact mask and etch

Next, as will be well understood by those skilled in the art a contact mask (not shown) is formed over the glass layer 34. The contact mask is formed by lithography and the glass layer 34 is etched by using a ROM code etching process providing an opening 32' down to contact the buried N+ region 32 below region 16 as seen in FIG. 8B.

Metal sputtering

A blanket metal layer 30 composed of aluminum, AlSi, AlSiCu or AlCu is formed by sputtering metal upon BPSG layer to a thickness of within the range between about 3,000 Å and about 15,000 Å.

Metal mask and etching

A metal mask (not shown) is formed and the metal layer 30 is etched by the process of RIE, or ECR etching.

Process of Formation of EPROM

Figure 9:
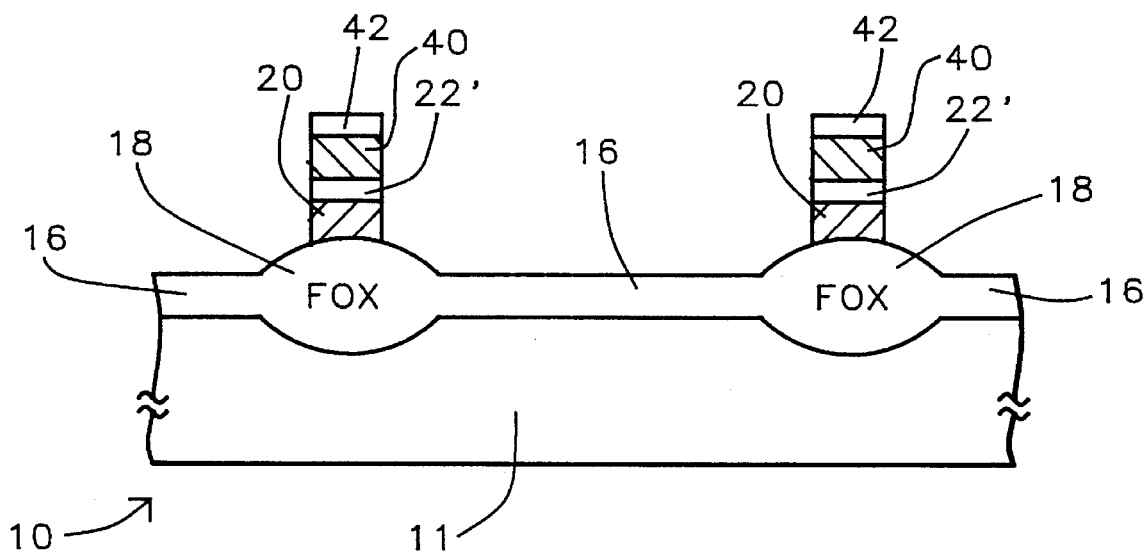

Referring to FIG. 9, the steps of a process for forming an EPROM in accordance with this invention are as follows:

Pad Oxide

A silicon dioxide layer (not shown) is formed by thermal oxidation at a temperature of between about 700° C. and about 1,100° C.

A layer of silicon nitride ($Si_3N_4$) (not shown) is deposited by LPCVD having a thickness of within the range between about 500 Å and about 5,000 Å. A mask is formed for the active area of the device over the silicon nitride ($Si_3N_4$) layer which is then etched with a silicon nitride etch. The silicon nitride ($Si_3N_4$) layer is etched through the active mask using plasma etching in a plasma chamber within the RF power range between about 50 watts and about 1,500 watts and within a pressure range between about 1 mTorr and about 100 Torr. A conventional field oxide process is performed next, forming the FOX regions 18 shown in FIG. 9. The silicon nitride layer deposited previously is now stripped from the device 11 with $H_3PO_4$ solution.

BN+ Mask and Ion Implantation

Figure 14:
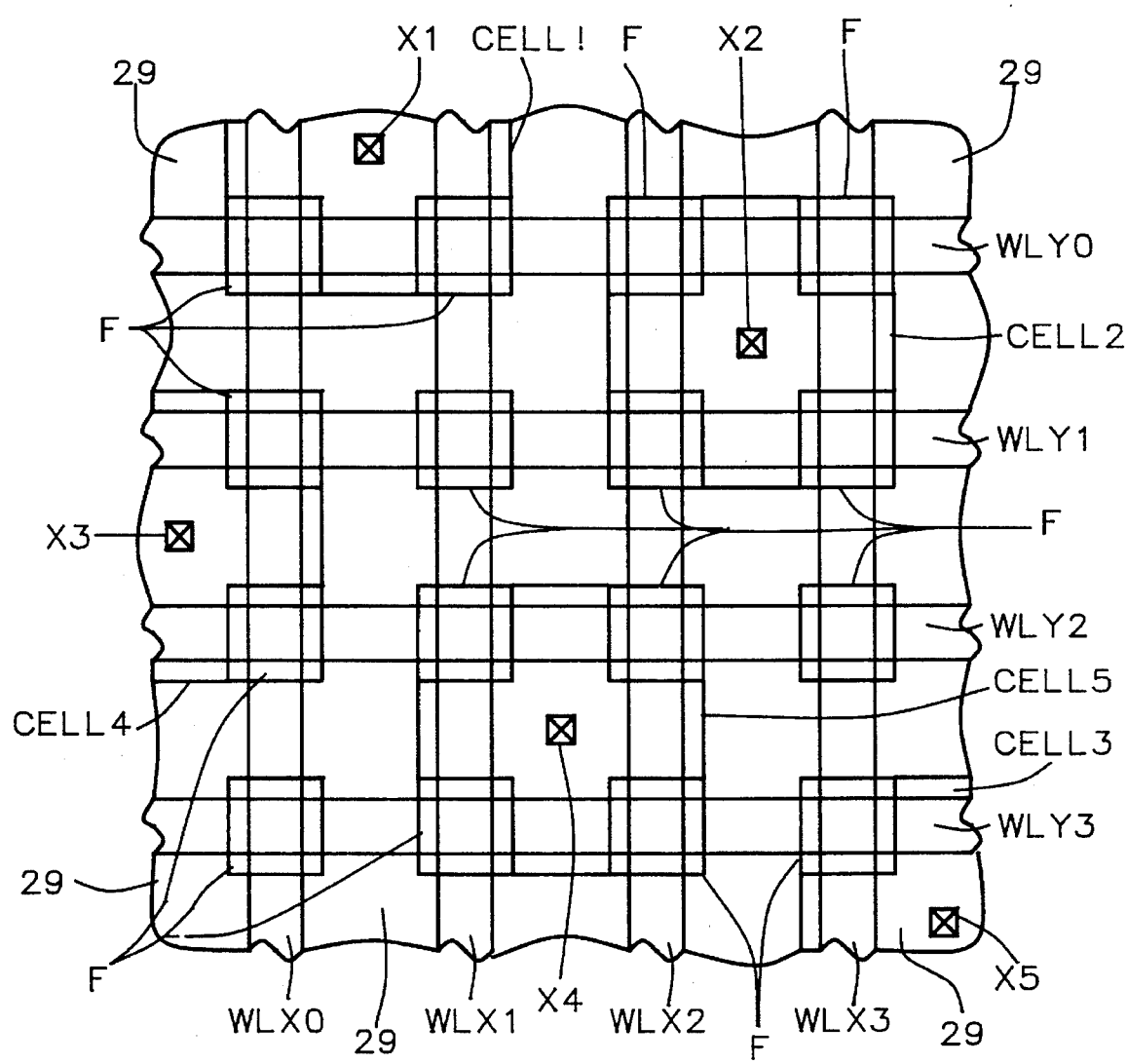
FIG. 14 shows a plan view of an EPROM or Flash memory device in accordance with this invention with Y direction word lines, X direction word lines, square field oxide regions, and memory cells which are connected to contacts and metal buried N+ bit lines in the P-substrate of the device.

Referring to FIG. 14, a conventional mask for a buried N+ region masks the cell areas ($C_1$, $C_2$, $C_3$, $C_4$, $C_5$, etc.) Then the remaining region is implanted by ion implantation with arsenic or phosphorus (to provide the buried N+ regions) with a dosage of between about 5 E 13 $cm^{-2}$ and about 1 E 16 $cm^{-2}$ with an energy of between about 20 keV and about 200 keV.

EPROM Silicon Dioxide I Growth

Silicon dioxide (gate oxide) layer 16 is formed with a thermal oxide process having a thickness between about 30 Å and about 300 Å grown within a temperature range between about 700° C. and about 1,000° C.

Deposition of Polysilicon 1 Layer and Doping

A polysilicon 1 layer 20 is deposited upon gate oxide layer 16 and FOX regions 18, followed by conventional doping. The polysilicon 1 layer 20 is deposited by the process of LPCVD (Low Pressure Chemical Vapor Deposition) within a pressure range between about 0.1 mTorr and about 100 Torr at a temperature within the range between about 500° C. and about 750° C.

Doping is performed by diffusion of $POCl_3$ or implantation at a doping level within the range between about 1 E 17 $cm^{-3}$ and about 1 E 22 $cm^{-3}$.

Polysilicon 1 Mask and Etch

A photoresist mask (not shown) for polysilicon 1 layer 20 is formed (by depositing photoresist which is then exposed to a pattern and developed) upon the remaining portions of silicon dioxide layer and on silicon nitride layer for etching of silicon dioxide layer, silicon nitride layer and the polysilicon 1 layer 20 layer as well in order to pattern layer 20.

in FIG. 4. The etching of the silicon nitride (SiN₄) layer is then performed using plasma etching in a plasma chamber within the RF power range between about 50 watts and about 1,500 watts and within a pressure range between about 1 mTorr and about 100 Torr.

Field Oxide

FIG. 1 shows conventional field oxide (FOX) regions 18 process formed by the conventional process. Then the silicon nitride layer (described above) deposited previously (not shown) is stripped from the device with phosphoric acid $H_3PO_4$ solution.

Gate Oxide Layer

FIG. 1 shows a gate oxide layer 16 which was is formed on semiconductor P-substrate (P-sub) 11 by the process of thermal growth in a furnace chamber within the temperature range between about 700° C. and about 1,000° C. and within a pressure range between about 1 mTorr and about 1,000 Torr.

First Polysilicon Layer and Doping Thereof

Referring again to FIG. 1, a polysilicon 1 layer 20 was next deposited upon gate oxide layer 16 and the FOX regions 18, followed by conventional doping.

The polysilicon 1 layer 20 is deposited by the process of LPCVD (Low Pressure Chemical Vapor Deposition) within a pressure range between about 0.1 mTorr and about 100 Torr at a temperature within the range between about 500° C. and about 750° C.

Doping is performed by diffusion of $POCl_3$ into layer 20 or implantation at a doping level within the range between about $1\,E\,17\,cm^{-3}$ and about $1\,E\,22\,cm^{-3}$.

CVD Silicon Dioxide or Thermal Silicon Dioxide

CVD silicon dioxide deposition formation of silicon dioxide layer 22 by deposition or thermal oxidation upon polysilicon 1 layer 20.

Mask for First Polysilicon Layer

A polysilicon 1 photoresist mask 23 is formed (by depositing photoresist which is then exposed to a pattern and developed) upon the silicon dioxide layer 22 for etching of silicon dioxide layer 22 and the polysilicon 1 layer 20 layer, in order to pattern layer 20 into parallel conductor lines 20 and 20' as seen in FIG. 4. Conductor lines 20 and 20' extend into the page as seen in cross section in FIGS. 1, 2, 3A and 3B.

Silicon Dioxide Etch

Mask 23 is then used for etching of silicon dioxide layer 22 in order to pattern silicon dioxide layer 22 as shown in FIG. 1.

Etching of First Polysilicon Layer

The polysilicon 1 layer 20 is then etched through the mask 23 using plasma etching in a plasma chamber within the RF power range between about 50 watts and about 5,000 watts and within a pressure range between about 1 mTorr and about 100 Torr, forming lines 20 and 20' as seen in FIG. 4.

Next, the photoresist mask 23 is stripped leaving the remaining stacks polysilicon 1 lines 20, 20' and silicon dioxide layer 22 on top of FOX structures 18.

Referring to FIG. 2, additional steps of a process in accordance with this invention are as follows:

Deposition of CVD Silicon Dioxide Spacer Layer

A blanket silicon dioxide layer 24 was formed by deposition or thermal oxidation upon the device of FIG. 1, after the mask 23 has been removed.

Spacer Etch

As seen in FIG. 2, the silicon dioxide spacer layer 24 has been etched Just long enough to leave spacer structures 24 over the FOX regions 18 and the stacks of polysilicon 1 lines 20, 20' and silicon dioxide layer 22. The etching process used is conventional and is timed to leave the spacer protection required, and as shown in FIG. 2.

Referring to FIG. 3 and 5, which are sectional views taken along line 3—3 and 5—5 in FIG. 4, an additional set of steps of a process for manufacture of a semiconductor memory in accordance with this invention are as follows:

Gate silicon dioxide 2

Gate oxide 2 layer 16 is formed on semiconductor P-substrate 11 by the process of thermal growth in a furnace chamber within the temperature range between about 700° C. and about 1,000° C. and within a pressure range between about 1 mTorr and about 1,000 Torr.

Polysilicon 2 Deposition and Doping

Referring to FIG. 3, a blanket deposit of polysilicon 2 layer 26 is formed upon gate oxide layer 16 and spacer structures 24 and the exposed portions of FOX regions 18, followed by conventional doping. Preferably, the polysilicon 2 blanket layer 26 is deposited by the process of LPCVD (Low Pressure Chemical Vapor Deposition) within a pressure range between about 0.1 m Torr and about 100 Torr at a temperature within the range between about 500° C. and about 750° C.

Doping is performed by diffusion of $POCl_3$ or ion implantation at a doping level within the range between about $1\,E\,17\,cm^{-3}$ and about $1\,E\,22\,cm^{-3}$.

Formation of Polysilicon 2 Mask

A polysilicon 2 photoresist mask 27 is formed (by depositing photoresist which is then exposed to a pattern and developed) upon the polysilicon 2 layer 26 layer in order to pattern layer 26 forming X word conductor lines 26, 26' as shown in FIG. 4 and FIG. 5, at right angles to Y word conductor lines 20, 20' as shown in FIG. 4.

polysilicon 2 etch

FIG. 5 taken along line 5—5 in FIG. 4 shows the device of FIG. 3 after the polysilicon 2 layer 26 has been etched through the mask 27 using plasma etching in a plasma chamber within the RF power range between about 50 watts and about 1,500 watts and within a pressure range between about 1 mTorr and about 100 Torr.

FIG. 4 is a plan view of a memory device in accordance with this invention showing a plan view after formation of the X word lines 26, 26' and the Y word lines 20, 20'.

FIG. 5 shows a section taken along line 5—5 in FIG. 4, which is at right angles to the section shown in FIG. 3, along the length of line 20'.

N+ S/D Mask and Ion Implant

A conventional N+ S/D implant process follows employing conventional ion implantation, the results of which are illustrated by FIGS. 6 and 7.

FIG. 6 shows a section taken along line 6—6 in FIG. 4 looking in the opposite direction from FIG. 3, with the N+ S/D regions 31, 32, and 33 in the substrate 11, between the conductors 20, 20' and FOX regions 18.

FIG. 7 shows a section taken along line 7—7 in FIG. 4 with the N+ S/D regions 131, 32, and 133 in the substrate 11, between the conductors 26, 26' and other FOX regions 18.

Contact and Metal Process

Referring to FIGS. 8A and 8B, the steps of a process in accordance with this invention are as follows:

Process of Formation of ROM

ROM mask and Ion Implantation

A lithography masking step is performed by means of conventional lithography with a ROM code mask 17' with an opening 17" for ion implantation of ions 17'" is performed in selected regions exposed through openings in the mask 17'. The ROM code implant is provided using ions 17'" of boron with a dose of between about 1 E 12 $cm^{-2}$ and about 1 E 15 $cm^{-2}$ with an energy of between about 30 keV and about 500 keV, with the implanted dopant 17 reaching a depth of between about 0.1 μm and about 2 μm.

BPSG Deposition

After the mask 17' has been removed from the device of FIG. 8A, a glass layer 34, preferably composed of BPSG has been formed with a thickness of between about 2,000 Å and about 10,000 Å with boron (B) about 2%–8% and phosphorous (P) about 2%–8%.

The device is next heated to reflow the BPSG layer 34 at a temperature of between about 700° C. and about 1,000° C.

BPSG layer 34 is deposited to a thickness of about 7,200 Å with boron (B) about 3.0% and phosphorous (P) about 4.6%. The process used in the prior art to deposit the BPSG layer 26 also comprises APCVD.

The process used to deposit the BPSG layer 34 is selected from APCVD, PECVD, LPCVD (Low Pressure C.V.D.) to deposit BPSG, BPTEOS, TEOS, etc. Formation of Contacts and Metal Process for ROM, EPROM

Contact mask and etch

Next, as will be well understood by those skilled in the art a contact mask (not shown) is formed over the glass layer 34. The contact mask is formed by lithography and the glass layer 34 is etched by using a ROM code etching process providing an opening 32' down to contact the buried N+ region 32 below region 16 as seen in FIG. 8B.

Metal sputtering

A blanket metal layer 30 composed of aluminum, AlSi, AlSiCu or AlCu is formed by sputtering metal upon BPSG layer to a thickness of within the range between about 3,000 Å and about 15,000 Å.

Metal mask and etching

A metal mask (not shown) is formed and the metal layer 30 is etched by the process of RIE, or ECR etching.

Process of Formation of EPROM

Referring to FIG. 9, the steps of a process for forming an EPROM in accordance with this invention are as follows:

Pad Oxide

A silicon dioxide layer (not shown) is formed by thermal oxidation at a temperature of between about 700° C. and about 1,100° C.

A layer of silicon nitride ($Si_3N_4$) (not shown) is deposited by LPCVD having a thickness of within the range between about 500 Å and about 5,000 Å. A mask is formed for the active area of the device over the silicon nitride ($Si_3N_4$) layer which is then etched with a silicon nitride etch. The silicon nitride ($Si_3N_4$) layer is etched through the active mask using plasma etching in a plasma chamber within the RF power range between about 50 watts and about 1,500 watts and within a pressure range between about 1 mTorr and about 100 Torr. A conventional field oxide process is performed next, forming the FOX regions 18 shown in FIG. 9. The silicon nitride layer deposited previously is now stripped from the device 11 with $H_3PO_4$ solution.

BN+ Mask and Ion Implantation

Referring to FIG. 14, a conventional mask for a buried N+ region masks the cell areas ($C_1$, $C_2$, $C_3$, $C_4$, $C_5$, etc.) Then the remaining region is implanted by ion implantation with arsenic or phosphorus (to provide the buried N+ regions) with a dosage of between about 5 E 13 $cm^{-2}$ and about 1 E 16 $cm^{-2}$ with an energy of between about 20 keV and about 200 keV.

EPROM Silicon Dioxide I Growth

Silicon dioxide (gate oxide) layer 16 is formed with a thermal oxide process having a thickness between about 30 Å and about 300 Å grown within a temperature range between about 700° C. and about 1,000° C.

Deposition of Polysilicon 1 Layer and Doping

A polysilicon 1 layer 20 is deposited upon gate oxide layer 16 and FOX regions 18, followed by conventional doping. The polysilicon 1 layer 20 is deposited by the process of LPCVD (Low Pressure Chemical Vapor Deposition) within a pressure range between about 0.1 mTorr and about 100 Torr at a temperature within the range between about 500° C. and about 750° C.

Doping is performed by diffusion of $POCl_3$ or implantation at a doping level within the range between about 1 E 17 $cm^{-3}$ and about 1 E 22 $cm^{-3}$.

Polysilicon 1 Mask and Etch

A photoresist mask (not shown) for polysilicon 1 layer 20 is formed (by depositing photoresist which is then exposed to a pattern and developed) upon the remaining portions of silicon dioxide layer and on silicon nitride layer for etching of silicon dioxide layer, silicon nitride layer and the polysilicon 1 layer 20 layer as well in order to pattern layer 20.

The polysilicon 1 layer 20 is then etched through the mask using plasma etching in a plasma chamber within the RF power range between about 50 watts and about 5,000 watts and within a pressure range between about 0.1 mTorr and about 100 Torr.

Doping is performed by $POCl_3$ or ion implantation at doping level within the range between about $1\,E\,17\,cm^{-3}$ and about $1\,E\,22\,cm^{-3}$.

Interpolysilicon Dielectric I (ONO)

An ONO set of layers 22' is formed by first forming a bottom silicon dioxide layer, followed by deposition of a silicon nitride ($Si_3N_4$) layer by LPCVD having a thickness of within the range between about 10 Å and about 300 Å. The silicon nitride ($Si_3N_4$) layer is then oxidized.

Deposition of Polysilicon 2 Layer and Doping

A polysilicon 2 layer 40 is deposited upon dielectric I (ONO) layer 22' and the FOX regions 18, followed by conventional doping. The polysilicon 2 layer 40 is deposited by the process of LPCVD (Low Pressure Chemical Vapor Deposition) within a pressure range between about 0.1 mTorr and about 100 Torr at a temperature within the range between about 500° C. and about 750° C.

Doping is performed by $POCl_3$ or implantation at a doping level within the range between about $1\,E\,17\,cm^{-3}$ and about $1\,E\,22\,cm^{-3}$.

A mask for polysilicon 2 layer 40 is formed (by depositing photoresist which is then exposed to a pattern and developed) upon the polysilicon 2 layer 40.

Silicon Dioxide and Polysilicon 2 Etch

The polysilicon 2 layer 40 is etched through the photoresist mask (not shown) polysilicon 2 layer 40 to pattern layer 40. The etching is performed using plasma etching in a plasma chamber within the RF power range between about 50 watts and about 5,000 watts and within a pressure range between about 1 mTorr and about 100 Torr.

SAE (Self Aligned Etching) I self aligned etching of ONO layer 22' and polysilicon 1 layer 20 is performed at this point. Use of SAE (self aligned etching) is a normal process of EPROM manufacture.)

Figure 10:
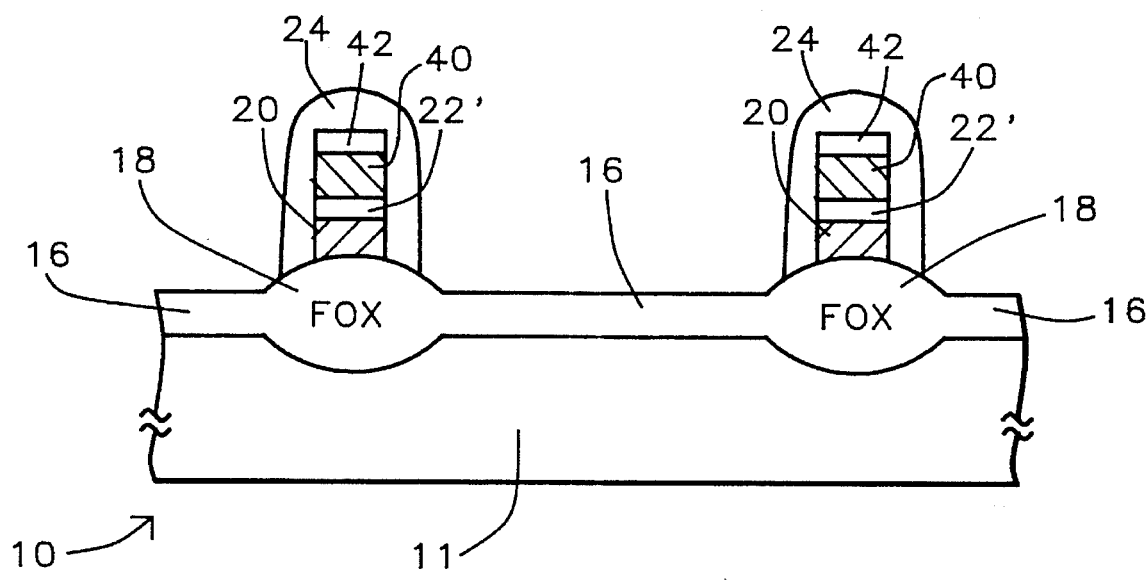

Referring to FIG. 10, the continuing steps of a process in accordance with this invention are as follows:

CVD Spacer Silicon Dioxide Deposition

Next, the product of FIG. 9 is coated with a blanket layer of a silicon dioxide spacer layer 24 thereon. The silicon dioxide spacer layer 24 is deposited by the process of thermal growth in a furnace chamber within the temperature range between about 700° C. and about 1,000° C. and within a pressure range between about 1 mTorr and about 1,000 Torr.

Spacer Etch

FIG. 10 shows the product of FIG. 9 after the spacer layer 24 has been etched in a spacer etch leaving the spacer structures 24 as shown in FIG. 10. The silicon dioxide spacer layer 24 is etched by CVD through a mask (not shown). The etching process uses an etching process selected from RIE and plasma etching in a plasma chamber within the RF power range between about 100 watts and about 1,500 watts and within a pressure range between about 1 mTorr and about 100 Torr.

Figure 11:
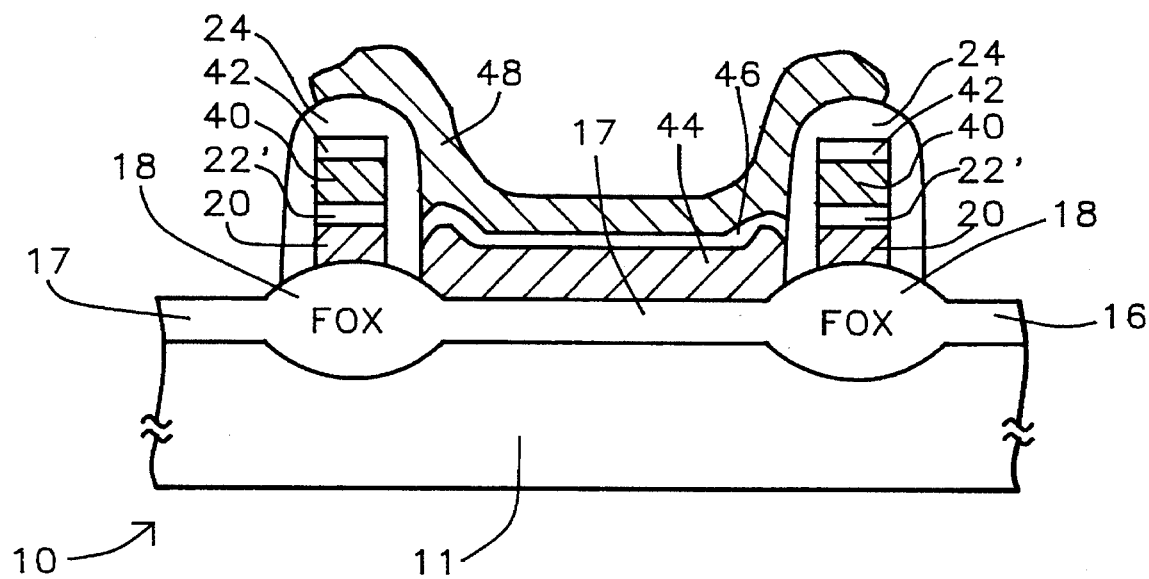

Referring to FIG. 11, the continuing steps of a process in accordance with this invention are as follows:

EPROM Silicon Dioxide II Growth

Referring to FIG. 11, layer 17 is the EPROM silicon dioxide II whereas layer 16 is the EPROM silicon dioxide I layer with thickness of within the range between about 50 Å and about 500 Å grown within the temperature range between about 800° C. and about 1,100° C. in an atmosphere of $O_2$ gas.

Polysilicon 3 Deposition and Doping

A polysilicon 3 layer 44 is deposited upon gate oxide layer 16 and the spacer layer 24, followed by conventional doping. The polysilicon 3 layer 44 is deposited by the process of LPCVD (Low Pressure Chemical Vapor Deposition) within a pressure range between about 0.1 mTorr and about 100 Torr at a temperature within the range between about 500° C. and about 750° C.

Doping is performed by $POCl_3$ or implantation at a doping level within the range between about $1\,E\,17\,cm^{-3}$ and about $1\,E\,22\,cm^{-3}$.

Polysilicon 3 Mask and Etch

A polysilicon 3 photoresist mask (not shown) is formed (by depositing photoresist which is then exposed to a pattern and developed) for etching of the polysilicon 3 layer 44 layer in order to pattern layer 44.

Interpolysilicon Dielectric II (ONO)

An ONO layer interpolysilicon dielectric layer 46 is formed over polysilicon 3 layer 44 in a similar manner to layer 22, as described above.

Polysilicon 4 Deposition and Doping

A polysilicon 4 layer 48 is deposited upon dielectric layer 46 and the spacer layer 24, followed by conventional doping. The polysilicon 4 layer 48 is deposited by the process of LPCVD (Low Pressure Chemical Vapor Deposition) within a pressure range between about 0.1 mTorr and about 100 Torr at a temperature within the range between about 500° C. and about 750° C.

Doping is performed by $POCl_3$ or implantation at a doping level within the range between about $1\,E\,17\,cm^{-3}$ and about $1\,E\,22\,cm^{-3}$.

Polysilicon 4 Mask and Polysilicon 4 Etch

A polysilicon 4 photoresist mask (not shown) is formed (by depositing photoresist which is then exposed to a pattern and developed) upon the remaining portions of the polysilicon 4 layer 48, in order to pattern layer 20.

SAE etching II

Self-Aligned Etching of ONO and Polysilicon 3

Self-aligned etching of the ONO layer 46 and the polysilicon 3 layer 44 is performed at this point.

N+S/D Ion implantation

The contact and metal process is the same as that for the DRAM and ROM as described above in connection with FIG. 8.

Process of Formation of DRAM

A DRAM is formed by a process in accordance with this invention. First, the process employed for formation of a DRAM is the same as that described above in connection with the process from FIGS. 1 to FIG. 3. Following the process illustrated from FIG. 1 to FIG. 3, the process flow is described with reference to FIGS. 12 and 13 below.

Briefly, the additional DRAM steps involve as follows:
depositing a silicon dioxide layer 31 over the device 10,
forming via openings 50' in the silicon dioxide layer 31,
forming and patterning a (polysilicon 3) capacitor plate layer 50 on the device 10,
forming an interconductor dielectric layer 51 over the capacitor plate layer 50, and
forming and patterning an upper conductor (polysilicon 4) layer 52 over the interconductor (ONO) dielectric layer 51.

Silicon Dioxide Deposition

Figure 12:
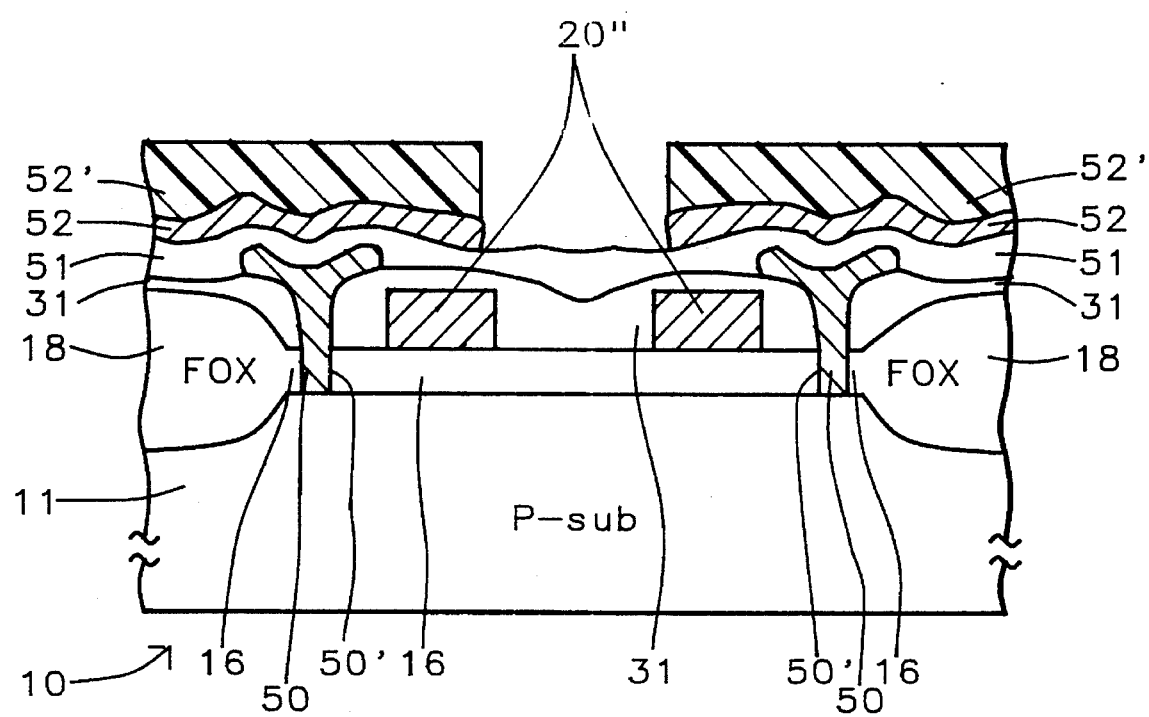

Referring to FIG. 12, a blanket silicon dioxide layer 31 is deposited over the exposed polysilicon 1 DRAM gates 20" and polysilicon 2 elements (not shown.) Layer 31 is deposited by a conventional process, such as an APCVD or a PECVD process.

A node mask and etch process has been used to provide VIA openings 50' in silicon dioxide layer 31. The VIA openings 50' extend down to P-substrate 11 for formation of metallic node VIAs (adjacent to gates 20") for the polysilicon 3 capacitor plate layer 50 as it is deposited in the next step in the form shown in FIG. 12.

Next, polysilicon 3 capacitor plate layer 50 is deposited upon $SiO_2$ layer 31, into VIAs 50' and upon the FOX regions 18, followed by conventional doping. The polysilicon 3 capacitor plate layer 50 is deposited by the process of LPCVD (Low Pressure Chemical Vapor Deposition) within a pressure range between about 0.1 mTorr and about 100 Torr at a temperature within the range between about 500° C. and about 750° C.

Doping is performed by $POCl_3$ or ion implantation at a doping level within the range between about 1 E 17 $cm^{-3}$ and about 1 E 22 $cm^{-3}$.

A conventional mask for polysilicon 3 capacitor plate layer 50 is formed (by depositing photoresist which is then exposed to a pattern and developed) upon the polysilicon 3 layer 50.

Next, a mask for polysilicon 3 capacitor plate layer 50 is formed (by depositing photoresist (not shown) which is then exposed to a pattern and developed) upon the polysilicon 3 capacitor plate layer 50.

The polysilicon 3 capacitor plate layer 50 is then etched through the openings in the photoresist mask (not shown) to pattern polysilicon 3 capacitor plate layer 50 in conformity with that mask into the configuration seen in FIG. 12. The etching is performed using plasma etching in a plasma chamber within the RF power range between about 50 watts and about 1,500 watts and within a pressure range between about 1 mTorr and about 100 Torr.

An ONO or ON sandwich of interpolysilicon dielectric layers 51 shown in FIG. 12 is formed over the third polysilicon layer 50 and silicon dioxide layer 31 by first forming a bottom silicon dioxide layer, followed by deposition of a silicon nitride ($Si_3N_4$) layer by LPCVD having a thickness of within the range between about 100 Å and about 300 Å. The silicon nitride ($Si_3N_4$) layer is then oxidized.

Next, a blanket polysilicon 4 layer 52 is deposited on the interpolysilicon dielectric layer 51, followed by conventional doping. The polysilicon 4 layer 52 is deposited by the process of LPCVD (Low Pressure Chemical Vapor Deposition) within a pressure range between about 0.1 mTorr and about 100 Torr at a temperature within the range between about 500° C. and about 750° C.

Doping of the polysilicon 4 layer 52 is performed with diffusion with $POCl_3$ or ion implantation at a doping level within the range between about 1 E 17 $cm^{-3}$ and about 1 E 22 $cm^{-3}$.

A polysilicon 4 photoresist mask 51' is formed (by depositing photoresist which is then exposed to a pattern and developed) for etching of the polysilicon 4 layer 52 layer in order to pattern layer 52. Then the polysilicon 4 layer 52 is using a similar process to the etching processes for polysilicon above.

BPSG deposition

Figure 13:
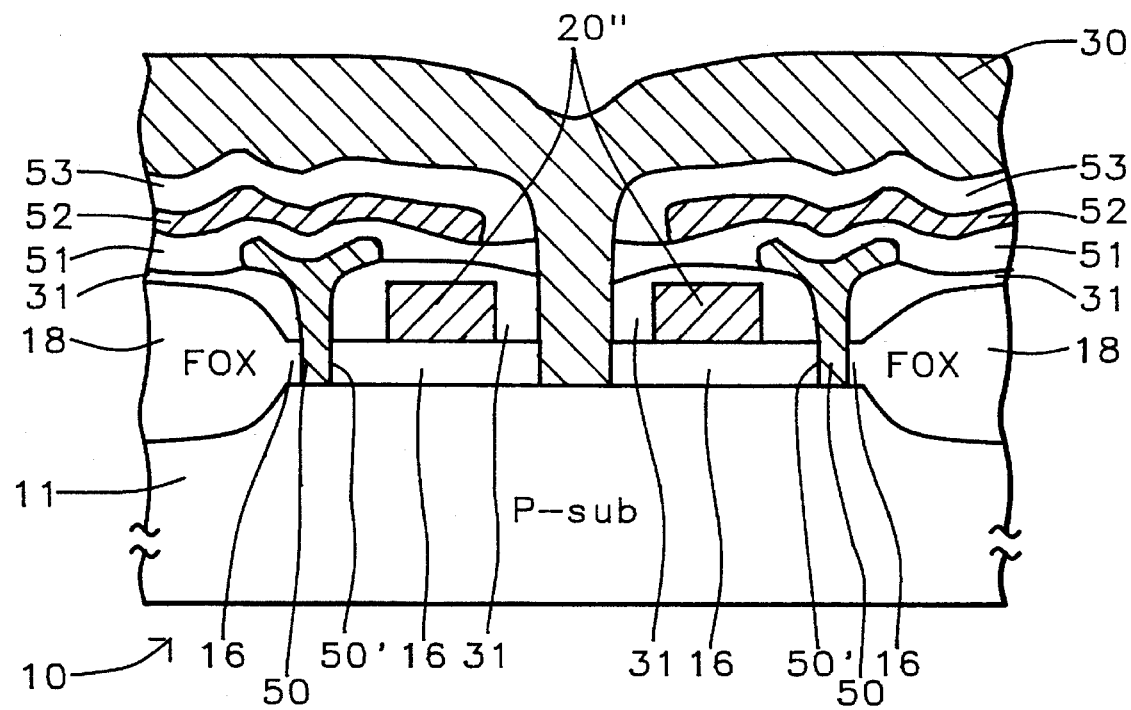

Referring to FIG. 13, the device of FIG. 12 is shown after mask 52' has been stripped and after formation thereon of a blanket glass layer 53, preferably composed of BPSG has been formed with a thickness of about 5,000 Å with boron (B) about 4.0% and phosphorous (P) about 4.0%.

The device is next heated to reflow the BPSG layer 53 at a temperature of about 900° C.

BPSG layer 53 is deposited to a thickness of about 7,200Å with boron (B) about 3.0% and phosphorous (P) about 4.6%. The process used in the prior art to deposit the BPSG layer 26 also comprises APCVD.

Next a contact mask (not shown) is formed by a conventional lithography process and BPSG layer 53 is etched by using an RIE etching process to open a contact opening down to the P-substrate for a metal layer 30 which is to be applied to the device in the next step.

Metal Sputtering

Metal layer 30 composed of aluminum, AlSi or AlSiCu is blanket deposited over the device 10 and down into the opening Just etched, into contact with P-substrate 11. Metal layer 30 is formed by sputtering metal upon BPSG layer 34 to a thickness of within the range between about 3,000 Å and about 15,000 Å.

Next, a metal mask (not shown) is formed and the metal layer 30 is etched by the process of RIE etching or ECR etching.

FIG. 14 shows a plan view of a ROM, EPROM or Flash memory device in accordance with this invention with Y direction word lines WLY0, WLY1, WLY2, WLY3, and X direction word lines WLX0, WLX1, WLX2, WLX3, square field oxide regions F, and cells C1, C2, C3, C4 and C5 which are connected by contact areas X1, X2, X3, X4 and X5 (shown in FIG. 16 as contact areas X) to metal bit lines BL1, BL2, . . . BL17, seen in FIG. 16. Regions 29 comprise the active area 29.

The shape of the mask used to form the active region is in the shape of the field oxide regions CELL 1, CELL 2, CELL 3, CELL 4 and CELL 5 and the active N+ region is formed in the areas outside of those plates. The N+ region is at voltage Vss. The memory nodes are the N+ region.

Figure 15:
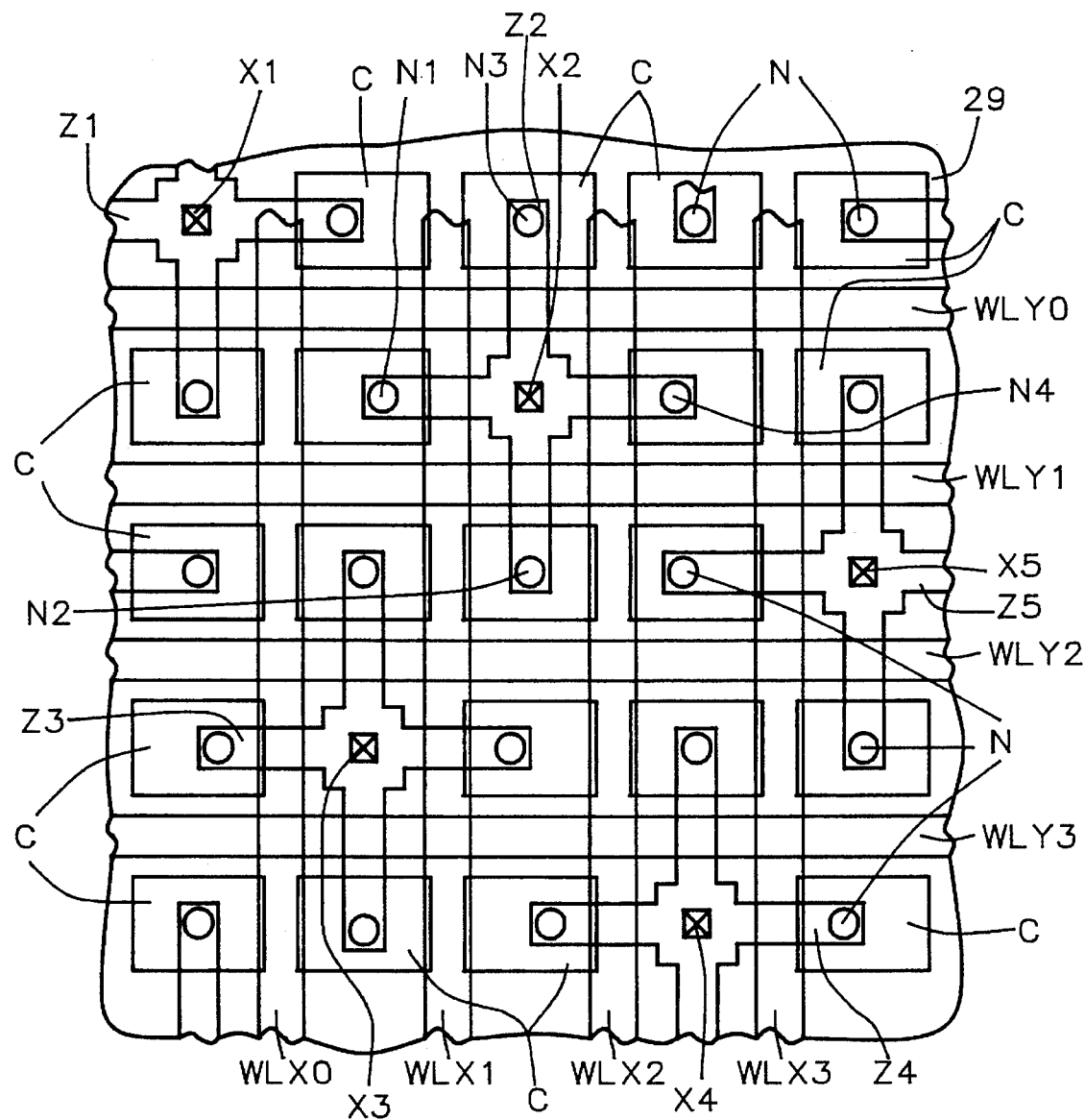
FIG. 15 is a plan view of a DRAM device in accordance with this invention with Y direction word lines and X direction word lines; capacitor nodes, contact regions, and capacitors C.

FIG. 15 is a plan view of a DRAM device in accordance with this invention with Y direction word lines WLY0, WLY1, WLY2, WLY3, and X direction word lines WLX0, WLX1, WLX2, WLX3, capacitor nodes N, including nodes N1, N2, N3 and N4, contact regions X1, X2, X3, X4 and X5 and capacitors C, and nodes Z1, Z2, Z3, Z4, and Z5 for connecting the cell transistor to the cell capacitor.

Figure 16:
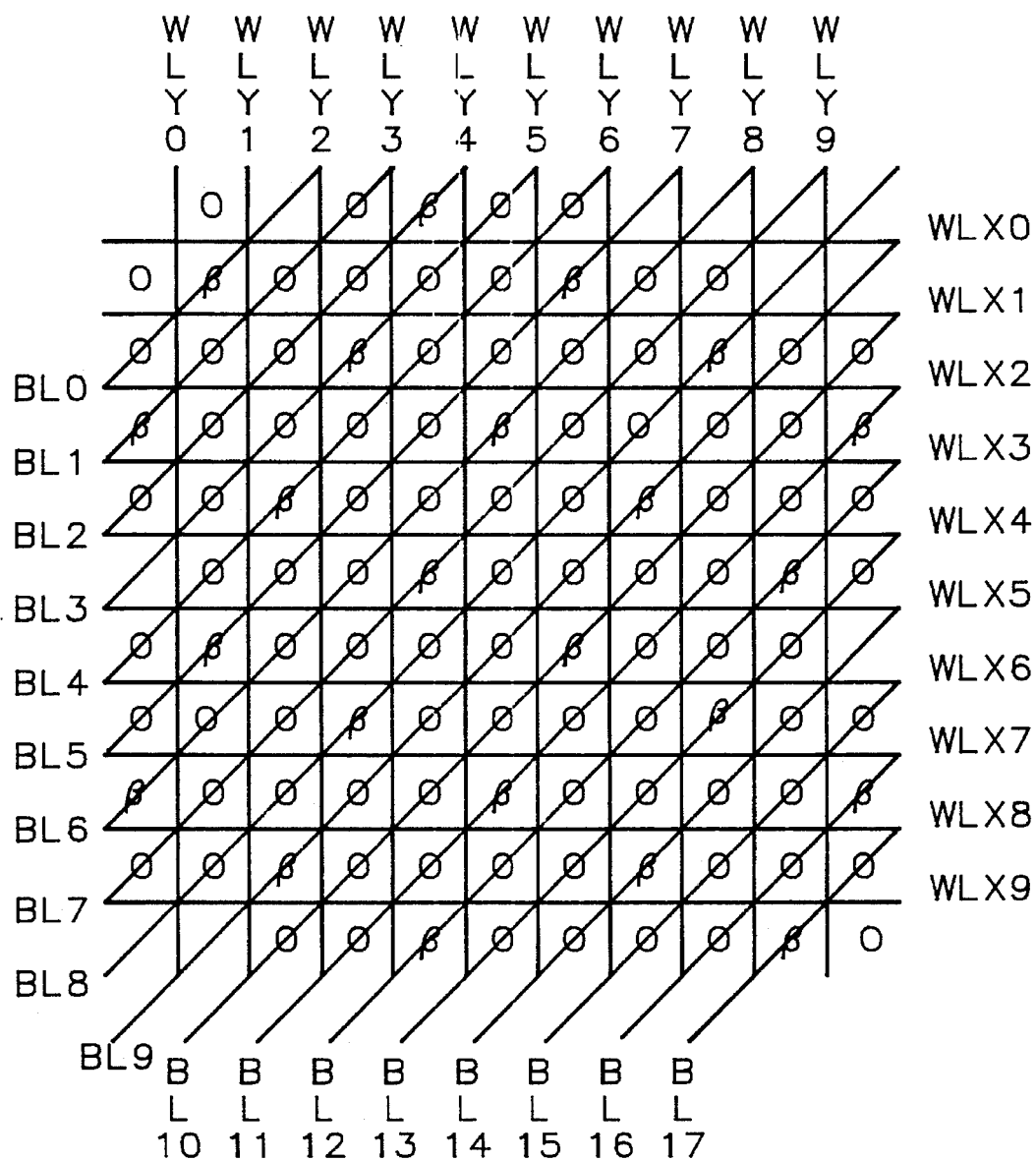
FIG. 16 shows a matrix of memory cells in accordance with this invention with diagonally disposed bit lines, vertical word lines and horizontally disposed word lines.

FIG. 16 shows a matrix of memory cells in accordance with this invention with diagonally disposed bit lines BL0 . . . BL9, vertical word lines WLY0, WLY1, WLY2, WLY3, WLY4, WLY5, WLY6, WLY7 WLY8, and WLY9, horizontally disposed word lines WLX0, WLX1, WLX2, WLX3, WLX4, WLX5, WLX6, WLX7 WLX8, and WLX9. In FIG. 16, contacts to bit lines are indicated by "β" and memory nodes are indicated by "0". The vertical word lines and the horizontal word lines are formed in two different layers of polysilicon or polycide, each layer of which includes an array of word lines, the pair of arrays being directed at right angles. In the case of a DRAM, the memory nodes are the capacitor nodes, such as nodes N1, N2, N3 and N4 as shown in FIG. 15. The memory nodes for a ROM, EPROM or Flash memory are the BN+ regions, i.e. buried N+ (V..) regions, formed as shown in FIG. 4.

While this invention has been described in terms of the above specific embodiment(s), those skilled in the art will recognize that the invention can be practiced with modifications within the spirit and scope of the appended claims, i.e. that changes can be made in form and detail, without departing from the spirit and scope of the invention. Accordingly all such changes come within the purview of the present invention and the invention encompasses the subject matter of the claims which follow.

Having thus described the invention, what is claimed as new and desirable to be secured by Letters Patent is as follows:

1. A method of manufacture of a semiconductor memory device on a semiconductor substrate in which an active region has been formed comprising the following steps:

a) forming field oxide structures on portions of a semiconductor substrate, said field oxide structures being juxtaposed with said active region and said field oxide structures leaving exposed surfaces elsewhere on said substrate, b) forming a gate oxide layer on said exposed surfaces of said substrate, c) forming a first word line layer on said device, d) patterning said first word line layer by forming a first patterned mask with a first set of openings therein and etching said first word line layer through said openings in said first mask to form conductor lines extending in the y direction, e) forming a first dielectric layer on a surface of said conductor lines on said device, f) forming a second word line layer on said first dielectric layer, g) patterning said second word line layer by forming a second patterned mask with a second set of openings therein and etching portions of said second word line layer through said second set of openings in said second patterned mask to form conductor lines extending in the x direction orthogonal to said y direction, h) forming a second dielectric layer on a surface of said second word line layer on said device, performing S/D ion implantation into said substrate forming doped regions in said substrate, and i) implanting ions of dopant into locations into said semiconductor substrate of said device, said dopant being of sufficient concentration to form a ROM coded region therein.

2. The method of claim 1 wherein said first dielectric layer comprises ONO.

3. The method of claim 1 wherein following said implanting of ions, a dielectric layer is deposited.

4. The method of claim 1 wherein following said implanting of ions, a BPSG dielectric layer is deposited following said BPSG dielectric layer deposition, a contact mask is formed over said BPSG layer followed by etching of said BPSG dielectric layer and said gate oxide layer to form a contact opening down to one of said doped regions in said substrate.

5. The method of claim 4 wherein following said contact mask formation a blanket metal sputtering step is performed extending down into said contact opening, and said first and second word lines comprise polysilicon.

6. A method of manufacture of a semiconductor memory device comprising the following steps:

forming field oxide structures on portions of a semiconductor substrate leaving exposed surfaces of said substrate elsewhere thereon, forming a gate oxide layer on exposed surfaces of said substrate, forming a first polysilicon layer on said device, patterning said first polysilicon layer by forming a first mask with openings and etching said first polysilicon layer through said openings in said first mask to form first conductors extending in the y direction, forming a first dielectric layer on a surface of said conductor lines on said device, forming a second polysilicon layer on said first dielectric layer, forming a second, photolithographic mask and etching portions of said second polysilicon layer to form second conductors extending in said y direction above said first conductors, forming a second dielectric layer on a surface of said second polysilicon layer on said device, forming a third polysilicon layer on said second dielectric layer, patterning said third polysilicon layer by forming a third mask and etching said third polysilicon layer through said third mask to form third conductors extending in the x direction orthogonal to said y direction, forming a third dielectric layer on a surface of said third polysilicon layer on said device, forming a fourth polysilicon layer on said second dielectric layer, patterning said fourth polysilicon layer by forming a fourth mask and etching said fourth polysilicon layer through said fourth mask to form fourth conductors extending in said x direction above said third conductors, and implanting ions of dopant into predetermined locations in said semiconductor substrate of said device, said dopant being of sufficient concentration to form a ROM coded region therein.

7. The method of claim 6 wherein said first dielectric layer comprises ONO.

8. The method of claim 6 wherein said first dielectric layer comprises an oxide.

9. The method of claim 6 wherein following said implanting of ions, a blanket BPSG dielectric layer is deposited.

10. The method of claim 6 wherein following said implanting of ions, a blanket BPSG dielectric layer is deposited and following said BPSG deposition, a contact mask is formed followed by etching said BPSG layer with an RIE etcher to form a contact opening therein.

11. The method of claim 10 wherein following said contact mask formation a metal sputtering step is performed.

12. A method of manufacture of a semiconductor memory device comprising the following steps:

forming field oxide structures on portions of a semiconductor substrate leaving exposed surfaces of said substrate elsewhere thereon, forming a gate oxide layer on exposed surfaces of said substrate, forming a first polysilicon layer on said device, patterning said first polysilicon layer by forming a first mask with openings and etching said first polysilicon layer through said openings in said first mask to form first conductors extending in the y direction, forming a first dielectric layer on a surface of said conductor lines on said device, forming a second polysilicon layer on said first dielectric layer, forming a second, photolithographic mask and etching portions of said second polysilicon layer forming second conductors extending in said y direction, forming a second dielectric layer on a surface of said second polysilicon layer on said device, forming a third polysilicon layer on said second dielectric layer, patterning said third polysilicon layer by forming a third mask and etching said third polysilicon layer through said third mask forming third conductors extending in the x direction orthogonal to said y direction, forming a third dielectric layer on a surface of said third polysilicon layer on said device, forming a fourth polysilicon layer on said third dielectric layer, patterning said fourth polysilicon layer by forming a fourth mask and etching said fourth polysilicon layer through said fourth mask forming fourth conductors extending in said x direction, and implanting ions of dopant into predetermined locations in said semiconductor substrate of said device, said dopant being of sufficient concentration to form a ROM coded region therein.

13. The method of claim 12 wherein said first dielectric layer comprises ONO.

14. The method of claim 12 wherein said first dielectric layer comprises an oxide.

15. The method of claim 12 wherein following said implanting of ions, a blanket BPSG dielectric layer is deposited.

16. The method of claim 12 wherein following said BPSG deposition, a contact mask is formed followed by etching said BPSG layer with an RIE etcher to form a contact opening therein.

17. The method of claim 16 wherein following said contact mask formation a metal sputtering step is performed.

* * * * *